United States Patent
Chiu et al.

(10) Patent No.: US 11,515,256 B2
(45) Date of Patent: Nov. 29, 2022

(54) SEMICONDUCTOR STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Ya-Chin Chiu, Taichung (TW); Ming-Hsien Lin, Taichung (TW); Chia-Tung Hsu, Hsinchu (TW); Lun-Chieh Chiu, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/160,251

(22) Filed: Jan. 27, 2021

(65) Prior Publication Data
US 2022/0238454 A1 Jul. 28, 2022

(51) Int. Cl.
*H01L 23/532* (2006.01)
*H01L 21/768* (2006.01)

(52) U.S. Cl.
CPC .. *H01L 23/53266* (2013.01); *H01L 21/76846* (2013.01)

(58) Field of Classification Search
CPC .............. H01L 21/76841–76876; H01L 23/53204–53285; H01L 24/03–06; H01L 24/18–20
See application file for complete search history.

(56) References Cited

U.S. PATENT DOCUMENTS

| | | | |
|---|---|---|---|
| 6,140,231 A * | 10/2000 | Lin | H01L 21/76846 438/653 |
| 6,187,673 B1 * | 2/2001 | Lai | H01L 21/76855 257/E21.585 |
| 6,274,487 B1 | 8/2001 | Suzuki | |
| 9,418,951 B2 * | 8/2016 | Wu | H01L 24/13 |
| 2002/0102838 A1 * | 8/2002 | Paranjpe | H01L 23/53238 438/622 |
| 2005/0035460 A1 * | 2/2005 | Tseng | H01L 21/76846 257/E21.585 |
| 2006/0027925 A1 * | 2/2006 | Huang | H01L 21/76862 257/751 |
| 2009/0029108 A1 | 1/2009 | Barth et al. | |
| 2014/0252608 A1 | 9/2014 | Chen et al. | |
| 2020/0136039 A1 | 4/2020 | Tsai et al. | |

FOREIGN PATENT DOCUMENTS

DE 112006000465 T5 4/2008
WO 2006/084825 A1 8/2006

* cited by examiner

*Primary Examiner* — Andres Munoz
(74) *Attorney, Agent, or Firm* — Maschoff Brennan

(57) ABSTRACT

A semiconductor structure includes a multi-level interconnect structure, a passivation layer, a barrier layer, and a pad layer. The passivation layer is above the multi-level interconnect structure. The barrier layer lines an inner sidewall of the passivation layer, a top surface of the passivation layer and a top surface of a conductive line of the multi-level interconnect structure. The barrier layer includes a first layer, a second layer, a third layer, and a fourth layer. The first layer is in a nano-crystalline phase. The second layer is above the first layer and in an amorphous phase. The third layer is above the second layer and in a polycrystalline phase. The fourth layer is above the third layer and in a nano-crystalline phase. The pad layer is above the barrier layer.

20 Claims, 13 Drawing Sheets

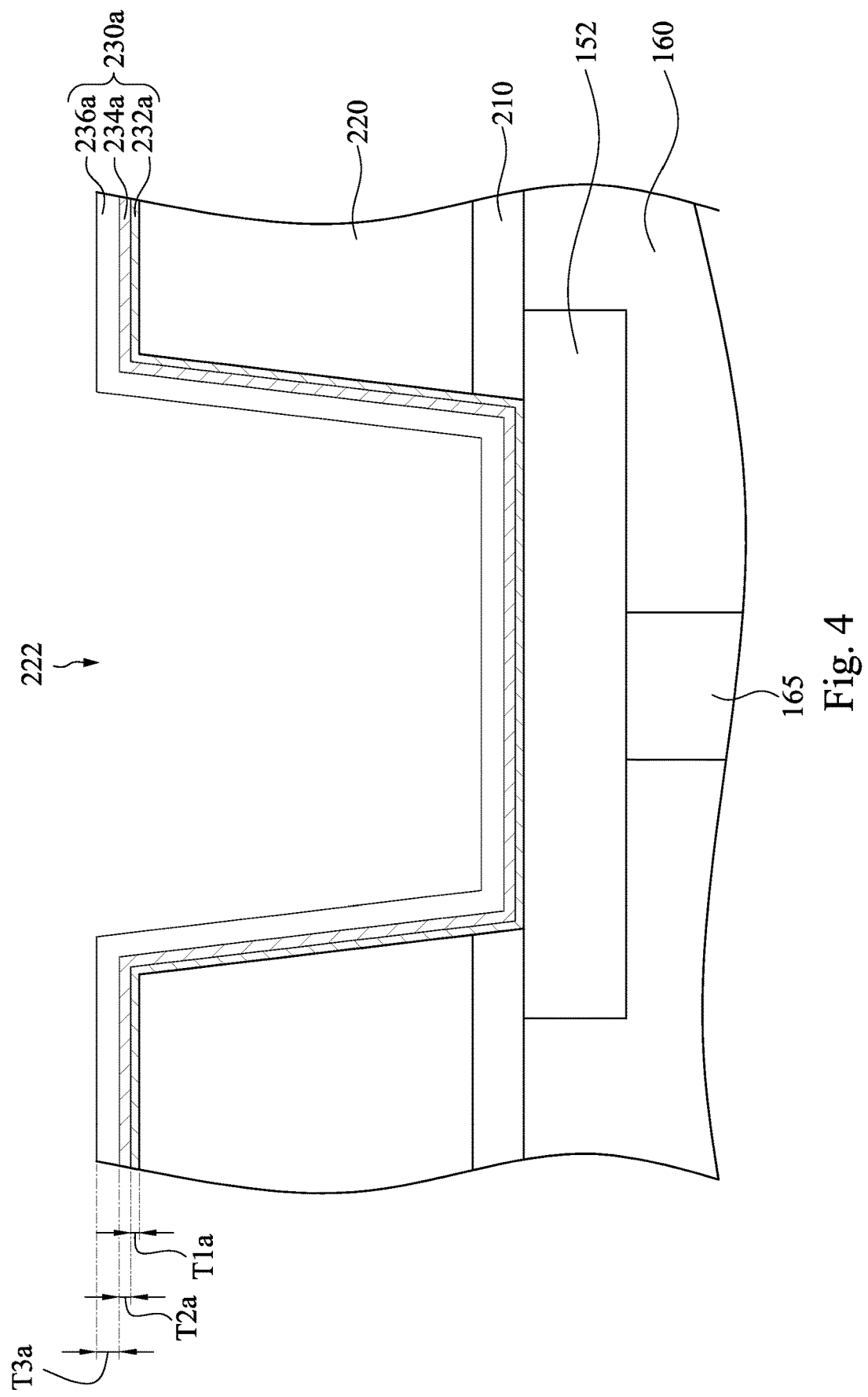

SEMICONDUCTOR STRUCTURE AND MANUFACTURING METHOD THEREOF

BACKGROUND

A semiconductor device includes one or numerous conductive metal layers serving as metal interconnect. The conductive metal layers couple various device components to one another through dielectric materials. The conductive metal layers are formed over one another and positioned at various device levels. Further, the semiconductor device includes an uppermost or top metal layer serving as a part of a pad structure. Hence, the top metal layer may electrically couple a solder bump or other external component, so as to enable electrical connection to the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-9B illustrate a method for manufacturing a semiconductor device at various stages in accordance with some embodiments of the present disclosure.

DETAILED DESCRIPTION

Figure 1:
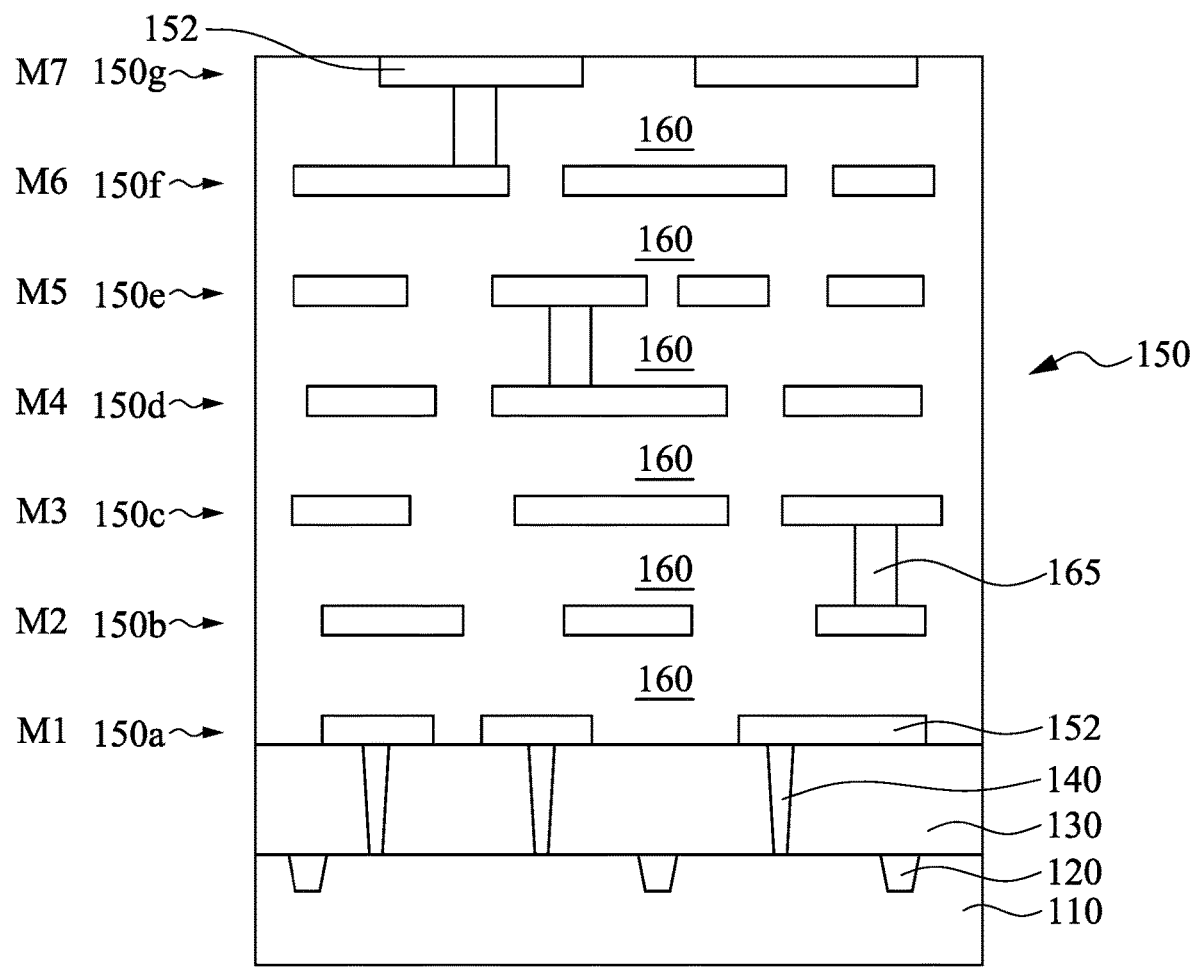

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Some embodiments of the present disclosure relate to semiconductor structures having multiple barrier layers to prevent metal from diffusion. With such configurations, metal elements of conductive lines underlying the barrier layers are not easy to pass through all of the multiple barrier layers, and the performance of the barrier layer is enhanced.

FIGS. 1-9B illustrate a method for manufacturing a semiconductor device at various stages in accordance with some embodiments of the present disclosure. In some embodiments, the semiconductor device shown in FIGS. 1-9B may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1. A substrate 110 is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

In some embodiments, a plurality of isolation features 120, such as shallow trench isolation (STI) features or local oxidation of silicon (LOCOS) features, are formed in the substrate 110. The isolation features 120 may define and isolate active regions for various microelectronic elements, such as transistors (metal oxide semiconductor field effect transistor (MOSFET), complementary metal oxide semiconductor (CMOS) transistor, bipolar junction transistor (BJT), high voltage transistor, high frequency transistor, etc.), resistors, diodes, capacitors, and other suitable elements. Accordingly, various processes are performed such as deposition, etching, implantation, photolithography, annealing, and other suitable processes that are available to one of ordinary skill in the art to form the microelectronic elements. The microelectronic elements are interconnected to form an integrated circuit such as a logic device, memory device (e.g., SRAM), RF device, input/output (I/O) device, system-on-chip (SoC) device, combinations thereof, and other suitable type of devices known in the art.

An interlayer dielectric (ILD) 130 is formed over the substrate 110 including the microelectronic elements. The ILD 130 may include silicon oxide, silicon oxynitride, or a low-k material. The ILD 130 may be formed by chemical vapor deposition (CVD), high density plasma CVD (HDP-CVD), spin-on, physical vapor deposition (PVD or sputtering), or other suitable technique. It should be noted a stressed layer such as a contact etch stop layer (CESL) may be formed over the substrate 110 prior to forming the ILD 130.

In some embodiments, a plurality of contacts 140 are formed in the ILD 130. The contacts 140 may be formed by patterning and etching the ILD 130 to form trenches. The trenches may be filled by depositing a metal barrier layer such as TiN, and then depositing a contact plug layer such as W on the metal barrier layer. In some embodiments, the metal barrier layer may include Ti/TiN for a W contact plug. In some other embodiments, the metal barrier layer may include Ta/TaN for a Cu contact plug. The contacts 140 provide connections to the various microelectronic elements formed in the substrate 110.

A multi-level interconnect structure 150 is formed above the ILD 130 and the contacts 140. The multi-level interconnect structure 150 includes a plurality of conductive layers 150a-150g that provide interconnections (wiring) between the various microelectronic elements, and between conductive layers themselves. It is understood that the number of conductive layers may vary depending on the design of the particular semiconductor device. In FIG. 1, the conductive layers 150a-150g include seven (7) conductive layers with a bottommost conductive layer 150a (M1), a topmost conductive layer 150g (M7), and conductive layers 150b-150f (M2-M6) between the bottommost conductive layer 150a and topmost conductive layer 150g. The conductive layers 150a-150g (M1-M7) may include lines formed of a conductive material such as aluminum, aluminum/silicon/copper alloy, titanium, titanium nitride, tungsten, polysilicon, metal silicide, or combinations thereof. Alternatively, the conductive layers 150a-150g may include lines formed of copper, copper alloy, titanium, titanium nitride, tantalum, tantalum nitride, tungsten, poly silicon, metal silicide, or combinations thereof.

The conductive layers 150a-150g (M1-M7) may be insulated from each other by inter-metal dielectric (IMD) layers 160. The IMD layers 160 may include a material of a low dielectric constant or low k value (low-k). In some embodiments, the IMD layers 160 at various levels of the multi-level interconnect structure 150 may be formed of different dielectric materials. It is has been observed that IMD layers 160 with low-K (LK), extreme low-K (ELK), and/or extra low-k (XLK) materials may enhance circuit performance. The material classification may be based upon a dielectric constant. For example, LK materials may refer to those materials with a k value less than approximately 3.5, and preferably less than approximately 3.0. The ELK materials may refer to those materials with a k value less than approximately 2.9, and preferably less than approximately 2.6. The XLK materials may refer to those materials which typically have a k value less than approximately 2.4. It is understood that the classifications are mere examples and that other classifications based on the dielectric constant of the material may be utilized as well. The LK, ELK, and/or XLK dielectric materials may include silicon nitride, silicon oxynitride, spin-on glass (SOG), undoped silicate glass (USG), fluorinated silica glass (FSG), carbon doped silicon oxide (e.g., SiCOH), carbon-containing material, Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, other proper porous polymeric materials, other suitable dielectric materials, and/or combinations thereof. The IMD layers 160 may be formed by a technique including spin-on, CVD, PVD, or atomic layer deposition (ALD).

The conductive layers 150a-150g and the IMD layers 160 may be formed in an integrated process such as a damascene process or lithography/plasma etching process. The bottommost conductive layer 150a (M1) may include conductive lines 152 that are coupled to the contacts 140 for connecting to the microelectronic elements formed in the substrate 110. The multi-level interconnect structure 150 may further include various metal vias 165 disposed within the IMD layers 160 for connecting the conductive lines 152 of adjacent conductive layers 150a-150g.

Figure 2:
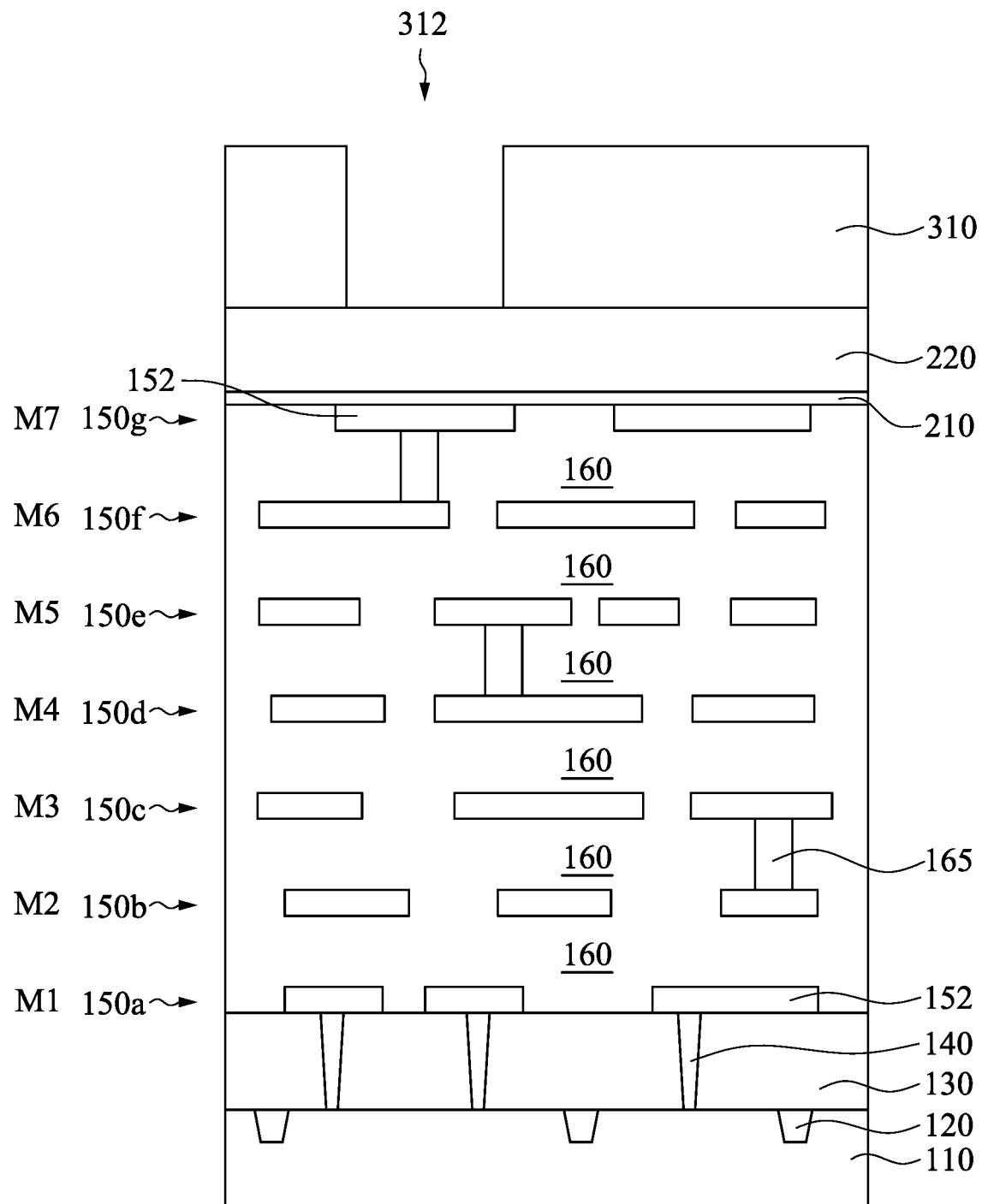

Reference is made to FIG. 2. An etch stop layer (ESL) 210 is formed above the conductive layers 150a-150g (M1-M7) and the IMD layers 160. In some embodiments, the ESL 210 provides a mechanism to stop an etching process when forming vias and/or contacts. The ESL 210 is formed of a dielectric material having a different etch selectivity from adjacent layers, e.g., the underlying conductive layer 150g. In some embodiments, the ESL 210 may be formed of SiNx, SiCN, SiO2, CN, $AlO_xN_y$, combinations thereof, or the like, deposited by CVD or PECVD techniques.

Subsequently, a first passivation layer 220 is formed above the ESL 210. The first passivation layer 220 may be made of non-organic material selected from un-doped silicate glass (USG), silicon nitride, silicon oxynitride, silicon oxide, and/or multi-layers thereof. Alternatively, the first passivation layer 220 may be made of a polymer layer, such as an epoxy, polyimide, benzocyclobutene (BCB), polybenzoxazole (PBO), and the like, although other relatively soft, often organic, dielectric materials can also be used. In some embodiments, a thickness of the first passivation layer 220 is greater than a thickness of the ESL 210.

A first photoresist layer 310 with an opening 312 is formed above the first passivation layer 220. The first photoresist layer 310 is formed by spin-on coating or other suitable technique. Other operations, such as baking, may follow the coating of the first photoresist layer 310. In some embodiments, the opening 312 exposes a portion of the first passivation layer 220 directly above one of the conductive lines 152 in the topmost conductive layer 150g (M7).

Figure 3A:
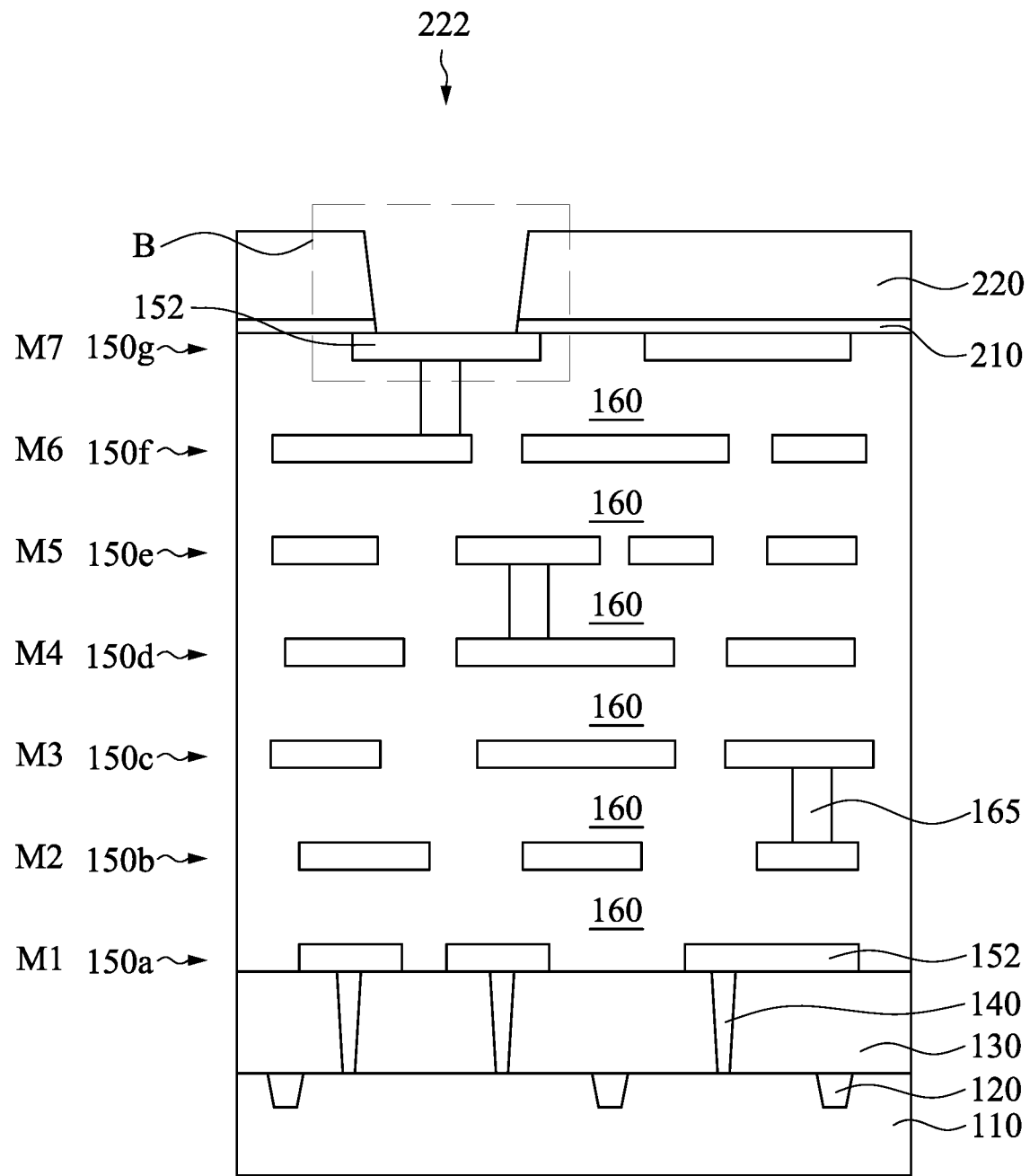
Figure 3B:
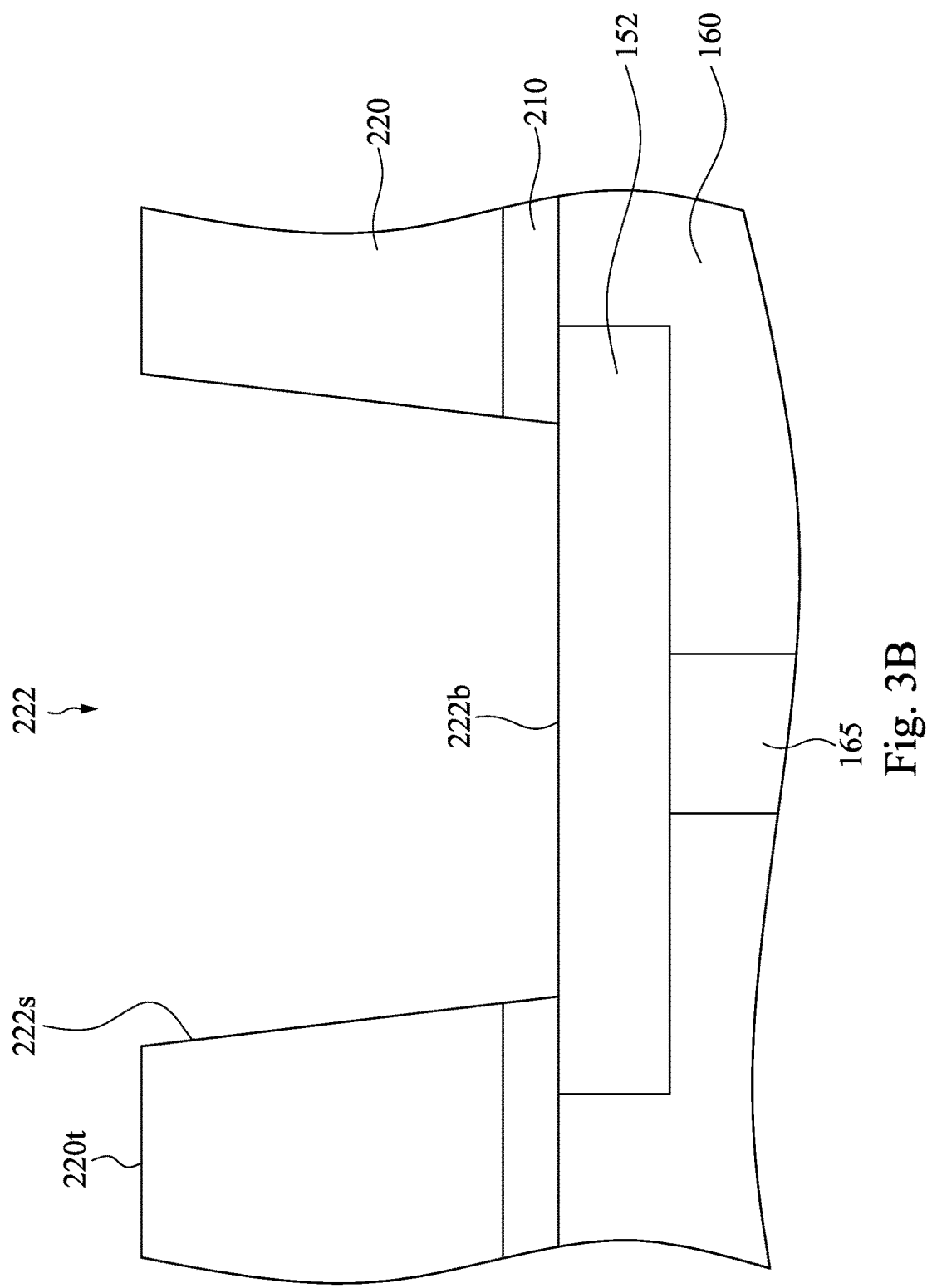

Reference is made to FIGS. 3A and 3B, where FIG. 3B is an enlarged view of area B in FIG. 3A. An opening 222 is formed in the first passivation layer 220 and the ESL 210 to expose a portion of the conductive line 152 in the topmost conductive layer 150g (M7). The portions of the first passivation layer 220 and the ESL 210 are removed based on the patterned photoresist layer 310 (see FIG. 2) to form the opening 222, and the patterned photoresist layer 310 is removed after the formation of the opening 222. In some embodiments, the opening 222 includes a bottom 222b (i.e., the top surface of the corresponding conductive line 152) and sidewalls 222s (i.e., the inner sidewalls of the first passivation layer 220).

Reference is made to FIG. 4. A barrier layer 230 (see FIG. 5) is conformally formed above the structure of FIG. 3A. That is, the barrier layer 230 lines the inner sidewalls 222s of the first passivation layer 220, a top surface 220t of the first passivation layer 220, and the top surface 222b of the conductive line 152. The barrier layer 230 may function as a barrier to prevent metal elements of the conductive line 152 from diffusing to the subsequently formed pad layer 240 (see FIG. 7) and/or prevent metal elements of the subsequently formed pad layer 240 from diffusing into the first passivation layer 220. Specifically, a first bottom layer 232a is deposited covering the sidewalls 222s and the bottom 222b of the opening 222. That is, the first bottom layer 232a is conformally formed in the opening 222. By forming the first bottom layer 232a conformally, the first bottom layer 232a will have a substantially equal thickness along the sidewalls 222s of the opening 222 and also along the bottom 222b of the opening 222. The first bottom layer 232a may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like.

In some embodiments, the first bottom layer 232a is made of tantalum, titanium, combinations thereof, or the like. In some embodiments, the first bottom layer 232a is a metal layer. In some other embodiments, the first bottom layer 232a is a pure metal layer or a substantially pure metal layer, for example, with a metal percentage higher than about 99 percent. In some embodiments, the first bottom layer 232a is a nano-crystalline phase (very small crystals or grains, close to amorphous). In some embodiments, the first bottom layer 232a has a thickness T1a in a range of about 20 angstrom to about 30 angstrom. In some embodiments, the first bottom layer 232a is formed by PVD techniques using a source DC power in a range of about 475 kW to about 525 kW.

Next, a first middle layer 234a is conformally formed above the first bottom layer 232a. By forming the first middle layer 234a conformally, the first middle layer 234a will have a substantially equal thickness along the sidewalls 222s of the opening 222 and also along the bottom 222b of the opening 222. The first middle layer 234a may be formed using a process that will promote a conformal formation, such as atomic layer deposition (ALD). Other processes such as plasma enhanced chemical vapor deposition (PECVD) or plasma enhanced physical vapor deposition (PEPVD), wherein a bias is applied to the substrate 110 in order to lessen variations in the thickness of the first middle layer 234a, may alternatively be used. In some embodiments, the first middle layer 234a is formed by PVD techniques using a source DC power in a range of about 475 kW to about 525 kW. In some embodiments, the first bottom layer 232a and the first middle layer 234a are formed with substantially the same power (e.g., about 500 W).

In some embodiments, the first middle layer 234a is made of tantalum nitride, titanium nitride, combinations thereof, or the like. In some embodiments, the first middle layer 234a is a nitride layer. In some embodiments, a metal percentage of the first middle layer 234a is lower than the metal percentage of the first bottom layer 232a. In some embodiments, the first middle layer 234a is an amorphous phase. In some embodiments, the first middle layer 234a has a thickness T2a in a range of about 18 angstrom to about 22 angstrom. In some embodiments, the thickness T2a is greater than, less than, or substantially the same as the thickness T1a of the first bottom layer 232a.

Subsequently, a first top layer 236a is conformally formed above the first middle layer 234a. By forming the first top layer 236a conformally, the first top layer 236a will have a substantially equal thickness along the sidewalls 222s of the opening 222 and also along the bottom 222b of the opening 222. The first top layer 236a may be formed using a process that will promote a conformal formation, such as atomic layer deposition (ALD). Other processes such as plasma enhanced chemical vapor deposition (PECVD) or plasma enhanced physical vapor deposition (PEPVD), wherein a bias is applied to the substrate in order to lessen variations in the thickness of the first top layer 236a, may alternatively be used. In some embodiments, the first top layer 236a is formed by PVD techniques using a source DC power in a range of about 5700 kW to about 6300 kW. In some embodiments, the first top layer 236a is formed with a power higher than that of the first middle layer 234a for greater than about ten times.

In some embodiments, the first top layer 236a is made of tantalum nitride, titanium nitride, combinations thereof, or the like. In some embodiments, the first top layer 236a is a nitride layer. In some embodiments, a metal percentage of the first top layer 236a is lower than the metal percentage of the first bottom layer 232a. In some embodiments, the first top layer 236a is a poly-crystalline phase. In some embodiments, the first top layer 236a has a thickness T3a in a range of about 170 angstrom to about 190 angstrom. In some embodiments, the thickness T3a is greater than the thickness T2a of the first middle layer 234a. In some embodiments, the thickness T3a of the first top layer 236a is greater than the thickness T1a of the first bottom layer 232a. In FIG. 4, the first bottom layer 232a, the first middle layer 234a, and the first top layer 236a are together referred to as a first barrier layer 230a.

Figure 5:
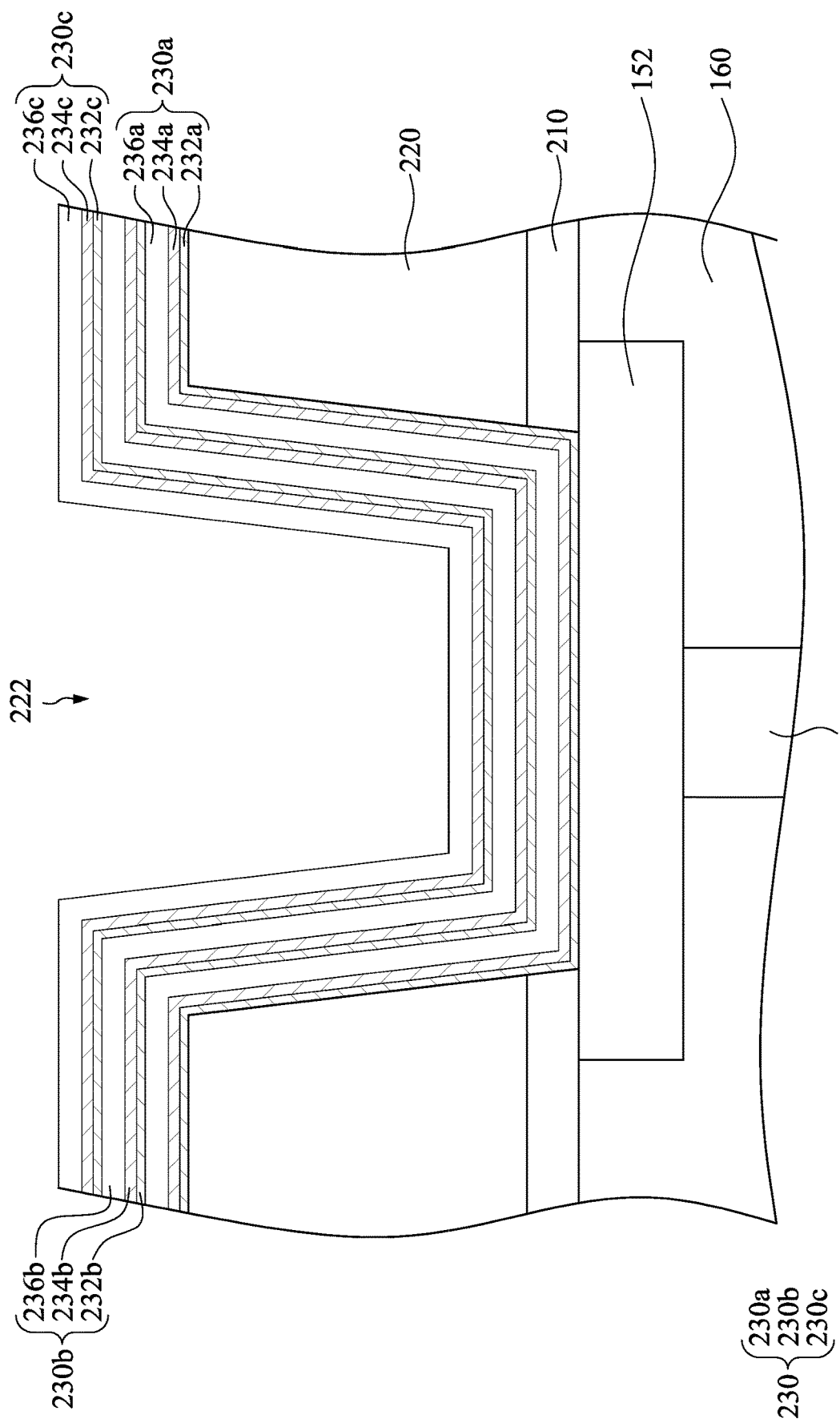

Reference is made to FIG. 5. A second barrier layer 230b of the barrier layer 230 is conformally formed above the first barrier layer 230a. The second barrier layer 230b includes a second bottom layer 232b, a second middle layer 234b, and a second top layer 236b. The formation and the material of the second bottom layer 232b are similar to or the same as the formation and the material of the first bottom layer 232a, and, therefore, a description in this regard will not be repeated hereinafter. The formation and the material of the second middle layer 234b are similar to or the same as the formation and the material of the first middle layer 234a, and, therefore, a description in this regard will not be repeated hereinafter. The formation and the material of the second top layer 236b are similar to or the same as the formation and the material of the first top layer 236a, and, therefore, a description in this regard will not be repeated hereinafter.

Subsequently, a third barrier layer 230c of the barrier layer 230 is conformally formed above the second barrier layer 230b. The third barrier layer 230c includes a third bottom layer 232c, a third middle layer 234c, and a third top layer 236c. The formation and the material of the third bottom layer 232c is similar to or the same as the formation and the material of the first bottom layer 232a, and, therefore, a description in this regard will not be repeated hereinafter. The formation and the material of the third middle layer 234c is similar to or the same as the formation and the material of the first middle layer 234a, and, therefore, a description in this regard will not be repeated hereinafter. The formation and the material of the third top layer 236c is similar to or the same as the formation and the material of the first top layer 236a, and, therefore, a description in this regard will not be repeated hereinafter. As such, the first barrier layer 230a, the second barrier layer 230b, and the third barrier layer 230c are together referred to as the barrier layer 230.

Figure 6:
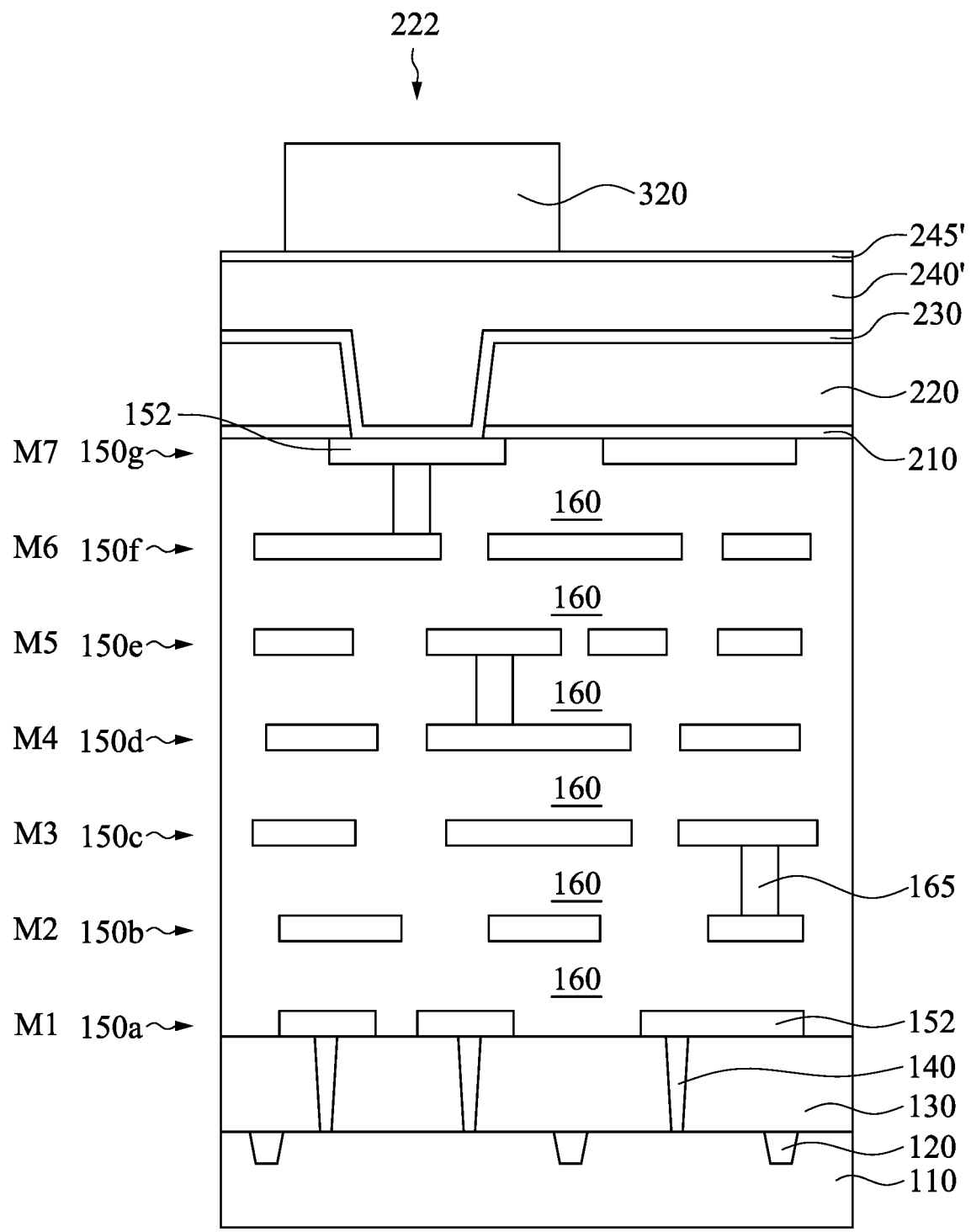

Reference is made to FIG. 6. Next, a conductive material 240' is formed above the barrier layer 230 and fills the remaining space of the opening 222. For clarity, the sub-layers (i.e., the layers shown in FIG. 5) of the barrier layer 230 are not shown in FIG. 6. In some embodiments, the conductive material 240' is a metal layer and may include aluminum (Al), although it may also be made of copper (Cu), silver (Ag), gold (Au), nickel (Ni), tungsten (W), alloys, or any combination thereof. In some other embodiments, the conductive material 240' may be made of aluminum copper (AlCu). In some embodiments, the conductive material 240' is made by using sputtering, physical vapor deposition (PVD), chemical vapor deposition (CVD), electrochemical copper plating (ECP), and the like.

Subsequently, an antireflective coating layer 245' is formed above the conductive material 240'. The antireflective coating layer 245' may be formed over the conductive material 240' to aid in a subsequent photolithographic process to pattern an overlying layer. The antireflective coating layer 245' prevents radiation in a subsequent photolithographic process to reflect off layers below and interfere with the exposure process. Such interference can increase the critical dimension of the photolithography process. The antireflective coating layer 245' may include SiON, a polymer, the like, or combinations thereof and may be formed by CVD, a spin-on process, the like, or combinations thereof. In some embodiments, the antireflective coating layer 245' is formed under a high temperature, e.g., greater than about 300 degrees Celsius, and the barrier layer 230 can prevent the metal elements in the conductive lines from passing through the barrier layer 230 and the conductive material 240' during the high temperature process for forming the antireflective coating layer 245'. The antireflective coating layer 245' has a thickness sufficient to provide sufficient antireflective qualities based upon the materials and the wavelength.

A second photoresist layer 320 is formed above the antireflective coating layer 245'. The second photoresist layer 320 is formed by spin-on coating or other suitable technique. Other operations, such as baking, may follow the coating of the second photoresist layer 320. The second photoresist layer 320 is formed directly above the opening 222, and portions of the antireflective coating layer 245' are uncovered by the second photoresist layer 320.

Figure 7:
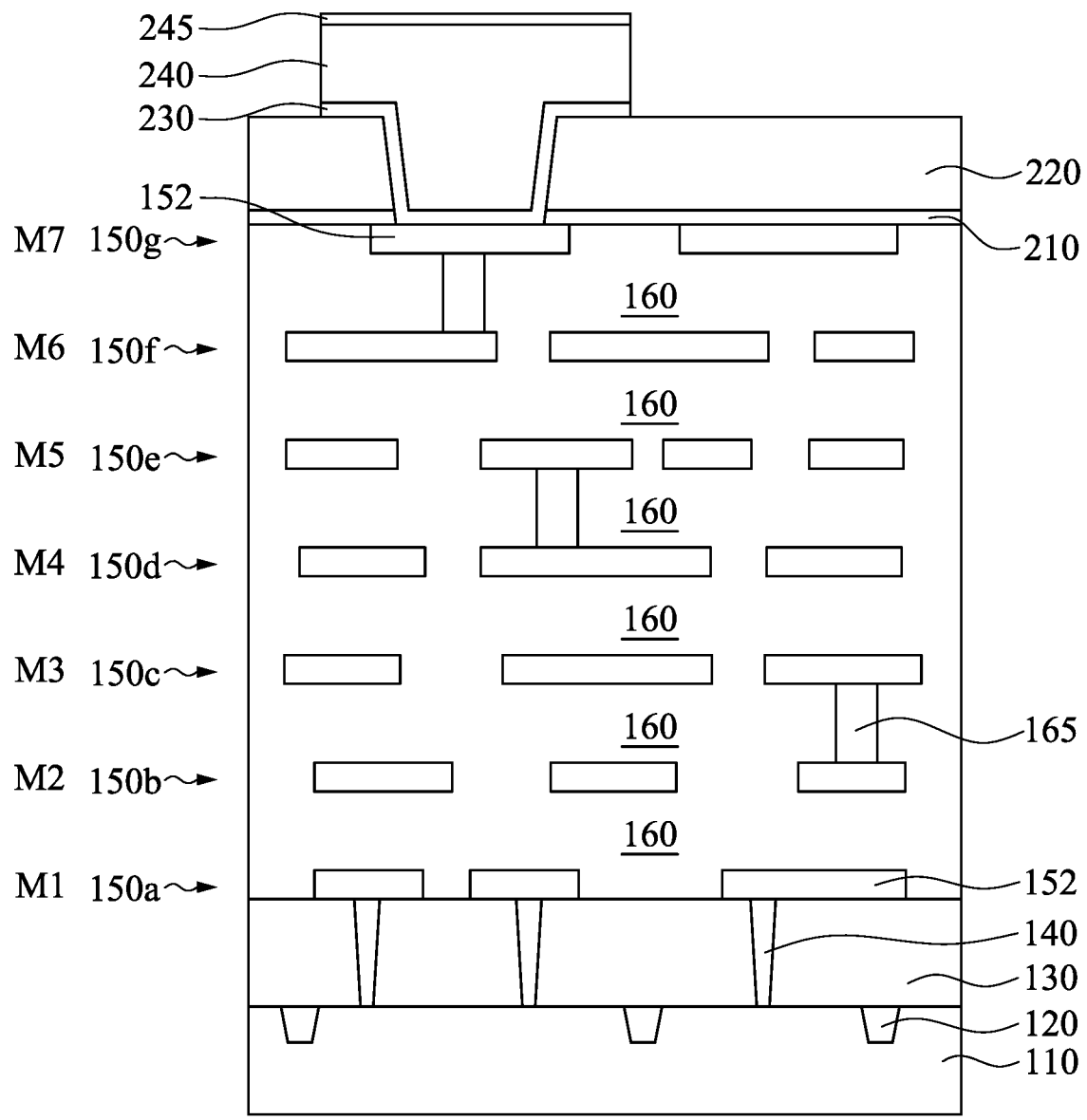

Reference is made to FIG. 7. The antireflective coating layer 245', the conductive material 240', and the barrier layer 230 are patterned using the second photoresist layer 320 (see FIG. 6) as a mask to form an antireflective coating layer 245, a pad layer 240, and a barrier layer 230 in the opening and above the first passivation layer 220, and the second photoresist layer 320 is removed.

Figure 8:
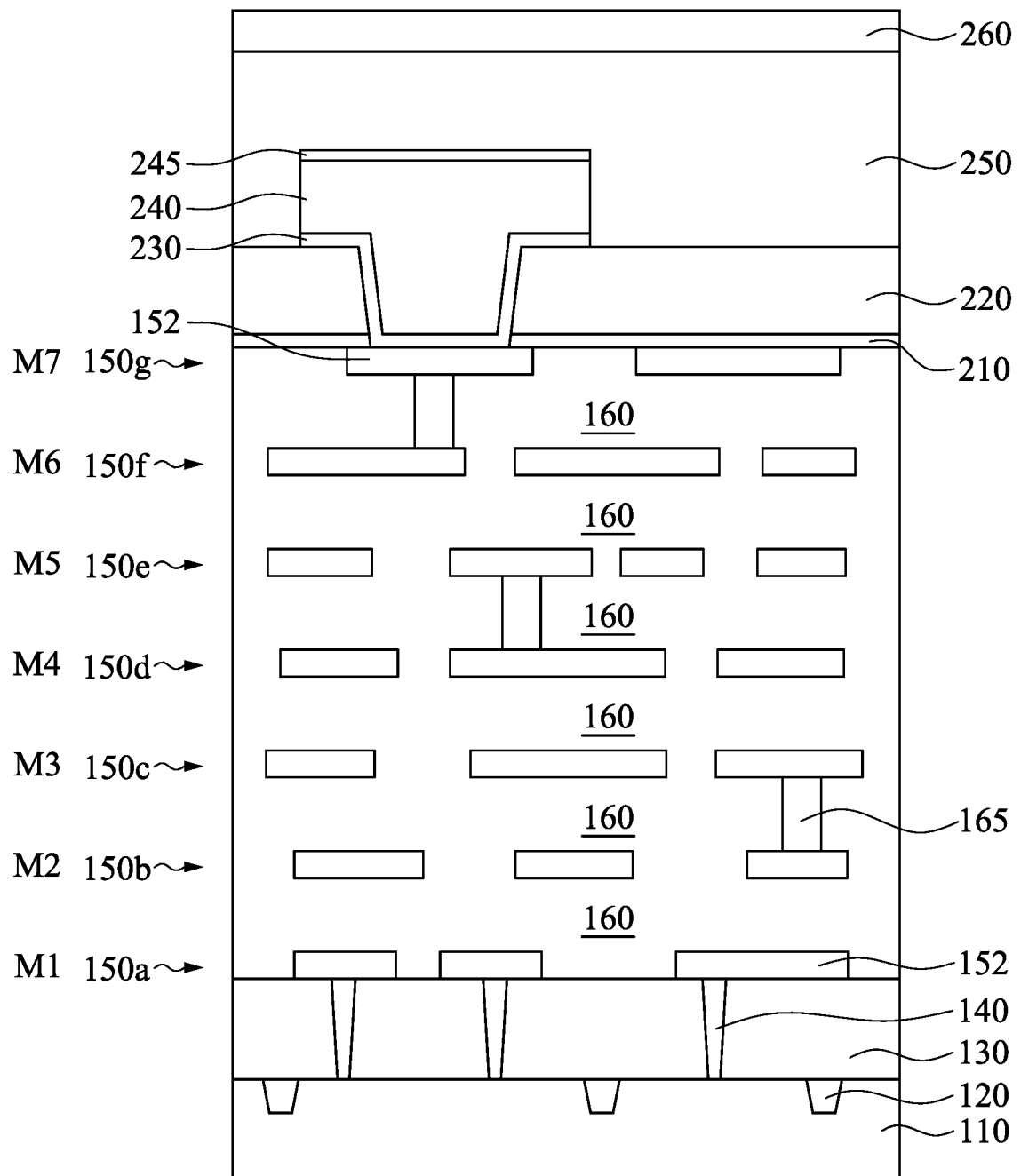

Reference is made to FIG. 8. A second passivation layer 250 is formed above the structure in FIG. 7. The formation and material of the second passivation layer 250 are similar to or the same as the formation and the material of the first passivation layer 220, and, therefore, a description in this regard will not be repeated hereinafter. Subsequently, a third passivation layer 260 is formed above the second passivation layer 250. The formation and material of the third passivation layer 260 are similar to or the same as the formation and the material of the ESL 210, and, therefore, a description in this regard will not be repeated hereinafter.

Figure 9A:
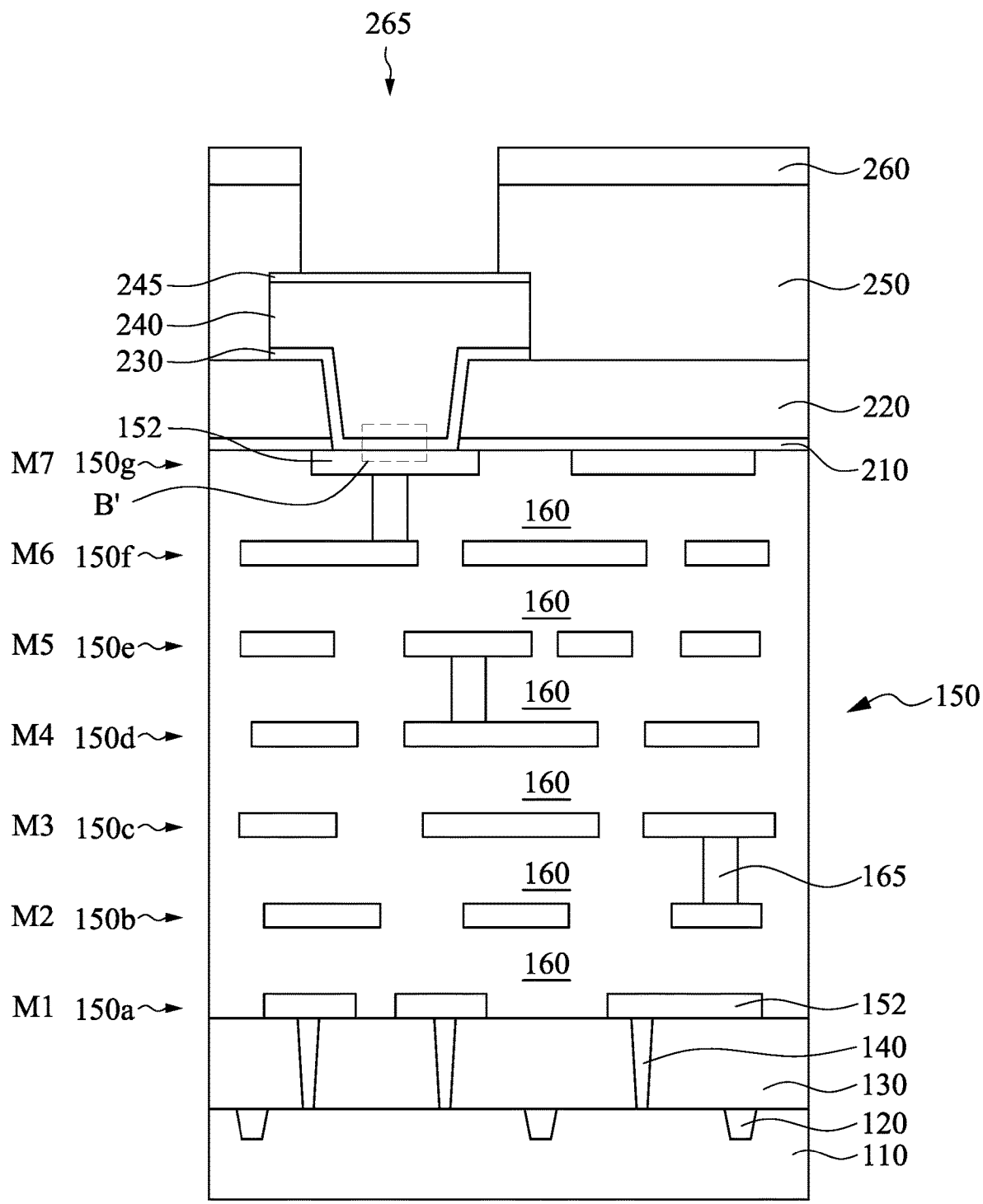
Figure 9B:
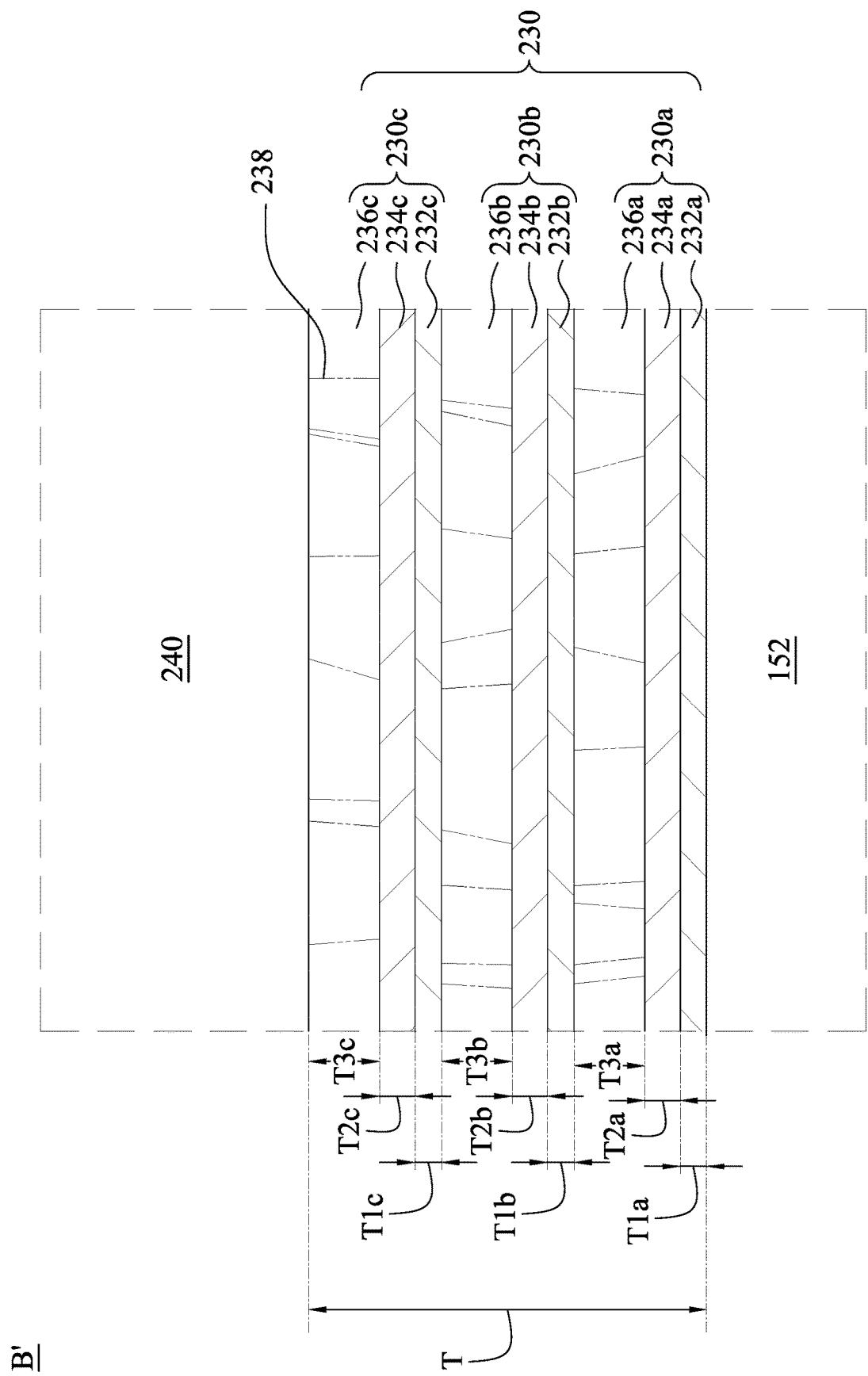

Reference is made to FIGS. 9A and 9B, where FIG. 9B is an enlarged view of area B' in FIG. 9A. A patterning process is performed on the second passivation layer 250 and third passivation layer 260, such that an opening 265 is formed in the second passivation layer 250 and third passivation layer 260 to expose a top surface of the antireflective coating layer 245. For example, another patterned photoresist is formed above the third passivation layer 260, and an etching process is performed to remove portions of the second passivation layer 250 and third passivation layer 260 exposed by the patterned photoresist. The patterned photoresist is then removed after the etching process.

A semiconductor structure shown in FIGS. 9A and 9B includes the multi-level interconnect structure 150, the first passivation layer 220, the barrier layer 230, and the pad layer 240. The first passivation layer 220 is above the multi-level interconnect structure 150 and exposes portions of the conductive line 152. The barrier layer 230 is conformally formed above the first passivation layer 220 and the conductive line 152. The pad layer 240 is above the barrier layer 230, such that the pad layer 240 can be electrically connected to the conductive line 152 through the barrier layer 230.

The barrier layer 230 includes the first barrier layer 230a, the second barrier layer 230b, and the third barrier layer 230c. The second barrier layer 230b is above the first barrier layer 230a, and the third barrier layer 230c is above the second barrier layer 230b. That is, the second barrier layer 230b is sandwiched between (and in directly contact with) the first barrier layer 230a and the third barrier layer 230c. The first barrier layer 230a is sandwiched between (and in directly contact with) the conductive line 152 (or the first passivation layer 220) and the second barrier layer 230b. The third barrier layer 230c is sandwiched between (and in directly contact with) the second barrier layer 230b and the pad layer 240.

The first barrier layer 230a includes the first bottom layer 232a, the first middle layer 234a, and the first top layer 236a. The second barrier layer 230b includes the second bottom layer 232b, the second middle layer 234b, and the second top layer 236b. The third barrier layer 230c includes the third bottom layer 232c, the third middle layer 234c, and the third top layer 236c.

In some embodiments, each of the first bottom layer 232a, the second bottom layer 232b, and the third bottom layer 232c is made of tantalum, titanium, combinations thereof, or the like. In some embodiments, each of the first bottom layer 232a, the second bottom layer 232b, and the third bottom layer 232c is a metal layer and free from nitrogen. In some other embodiments, each of the first bottom layer 232a, the second bottom layer 232b, and the third bottom layer 232c is a pure metal layer or a substantially pure metal layer, for example, with a metal percentage higher than about 99 percent. In some embodiments, each of the first bottom layer 232a, the second bottom layer 232b, and the third bottom layer 232c is a nano-crystalline phase (very small crystals or grains, close to amorphous). In some embodiments, each of the thickness T1a of the first bottom layer 232a, the thickness T1b of the second bottom layer 232b, and the thickness T1c of the third bottom layer 232c is a in a range of about 20 angstrom to about 30 angstrom. In some embodiments, the thickness T1a is greater than, equal to, or less than the thickness T1b (or T1c).

In some embodiments, each of the first middle layer 234a, the second middle layer 234b, and the third middle layer 234c is made of tantalum nitride, titanium nitride, combinations thereof, or the like. In some embodiments, each of the first middle layer 234a, the second middle layer 234b, and the third middle layer 234c is a nitride layer and has a higher nitrogen concentration than that of each of the first bottom layer 232a, the second bottom layer 232b, and the third bottom layer 232c. In some embodiments, a metal percentage of each of the first middle layer 234a, the second middle layer 234b, and the third middle layer 234c is lower than the metal percentage of the first bottom layer 232a. In some embodiments, each of the first middle layer 234a, the second middle layer 234b, and the third middle layer 234c is an amorphous phase. In some embodiments, each of the thickness T2a of the first middle layer 234a, the thickness T2b of the second middle layer 234b, and the thickness T2c of the third middle layer 234c in a range of about 18 angstrom to about 22 angstrom. In some embodiments, the thickness T2a is greater than, equal to, or less than the thickness T2b (or T2c).

In some embodiments, each of the first top layer 236a, the second top layer 236b, and the third top layer 236c is made of tantalum nitride, titanium nitride, combinations thereof, or the like. In some embodiments, each of the first top layer 236a, the second top layer 236b, and the third top layer 236c is a nitride layer and has a higher nitrogen concentration than that of each of the first bottom layer 232a, the second bottom layer 232b, and the third bottom layer 232c. In some embodiments, a metal percentage of each of the first top layer 236a, the second top layer 236b, and the third top layer 236c is lower than the metal percentage of the first bottom layer 232a. In some embodiments, each of the first top layer 236a, the second top layer 236b, and the third top layer 236c is a poly-crystalline phase. In some embodiments, each of the thickness T3a of the first top layer 236a, the thickness T3b of the second top layer 236b, and the thickness T3c of the third top layer 236c is in a range of about 170 angstrom to about 190 angstrom. In some embodiments, the thickness T3a is greater than, equal to, or less than the thickness T3b (or T3c).

In some embodiments, the first bottom layer 232a, the first middle layer 234a, and the first top layer 236a include the same metal (e.g., tantalum). In some embodiments, the second bottom layer 232b, the second middle layer 234b, and the second top layer 236b include the same metal (e.g., tantalum). In some embodiments, the third bottom layer 232c, the third middle layer 234c, and the third top layer 236c include the same metal (e.g., tantalum). In some embodiments, the barrier layer 230 has a thickness T in a range of about 624 angstrom to about 726 angstrom. If the thickness T is greater than about 726 angstrom, the barrier layer 230 may have high resistance; if the thickness T is less than about 624 angstrom, the electrical performance of the barrier layer 230 may be undesirable. In some embodiments, a ratio of T2a:T3a is in a range of about 0.094 and about 0.129. If the ratio of T2a:T3a is out of this range, the barrier layer 230 may not meet the desired electrical performance of the semiconductor device. In some embodiments, a sum of the thicknesses T1a, T2a, and T3a is in a range of about 208 angstrom and about 242 angstrom. If the sum of the thicknesses T1a, T2a, and T3a is greater than about 242 angstrom, the barrier layer 230 may have high resistance; if the sum of the thicknesses T1a, T2a, and T3a is less than about 208 angstrom, the electrical performance of the barrier layer 230 may be undesirable. In some embodiments, the ratio of T1a:T2a:T3a is substantially equal to the ratio of T1b:T2b:T3b and substantially equal to the ratio of T1c:T2c:T3c. As such, the electrical performance of the pad layer 240 is improved. In some embodiments, the ratio of T1a:T2a:T3a may be in a range of about 1.2:1:8.5 to about 1.3:1:9.5, e.g., about 1.25:1:9. If the ratio of T1a:T2a:T3a is out of this range, the barrier layer 230 may not meet the desired electrical performance of the semiconductor device.

As shown in FIG. 9B, since the first top layer 236a, the second top layer 236b, and the third top layer 236c are in poly-crystalline phases, threading dislocation defects 238 may be formed therein. On contrary, the threading dislocation defects may not exist in the first bottom layer 232a, the second bottom layer 232b, and the third bottom layer 232c since they are in nano-crystalline phases. In FIG. 9B, since the first top layer 236a, the second top layer 236b, and the third top layer 236c are formed separately, and the second bottom layer 232b and the third bottom layer 232c are interposed therebetween, the threading dislocation defects 238 in the first top layer 236a, the second top layer 236b, and the third top layer 236c are misaligned with each other.

Metal elements in the conductive line 152 may pass through the threading dislocation defects 238 in the first top layer 236a during a thermal process (e.g., the deposition process of the antireflective coating layer 245' as shown in FIG. 6). The metal elements, however, may be blocked by the second bottom layer 232b and the second middle layer 234b since there is no threading dislocation defects 238 therein. Even if rare or some metal elements still pass through the second bottom layer 232b and the second middle layer 234b, the misaligned configuration of the threading dislocation defects 238 in the second top layer 236b still help blocking the diffusion of the metal elements. Also, the third bottom layer 232c, the third middle layer 234c, and the third top layer 236c have the same function as the second bottom layer 232b, the second middle layer 234b, and the second top layer 236b. With such configuration, the fail rate of the semiconductor structure (e.g., the metal elements of the conductive line 152 diffused to the pad layer 240) is reduced to lower than about 1% in some embodiments.

In some embodiments, the semiconductor structure further includes the ESL 210 between the first passivation layer 220 and the conductive line 152 of the topmost conductive layer 150g. The ESL 210 is in direct contact with the first bottom layer 232a of the barrier layer 230. In some embodiments, the semiconductor structure further includes the antireflective coating layer 245 above the pad layer 240. In some embodiments, the semiconductor structure further includes the second passivation layer 250 and a third passivation layer 260. The second passivation layer 250 is above the first passivation layer 220 and the pad layer 240, and the third passivation layer 260 is above the second passivation layer 250.

Figure 10:
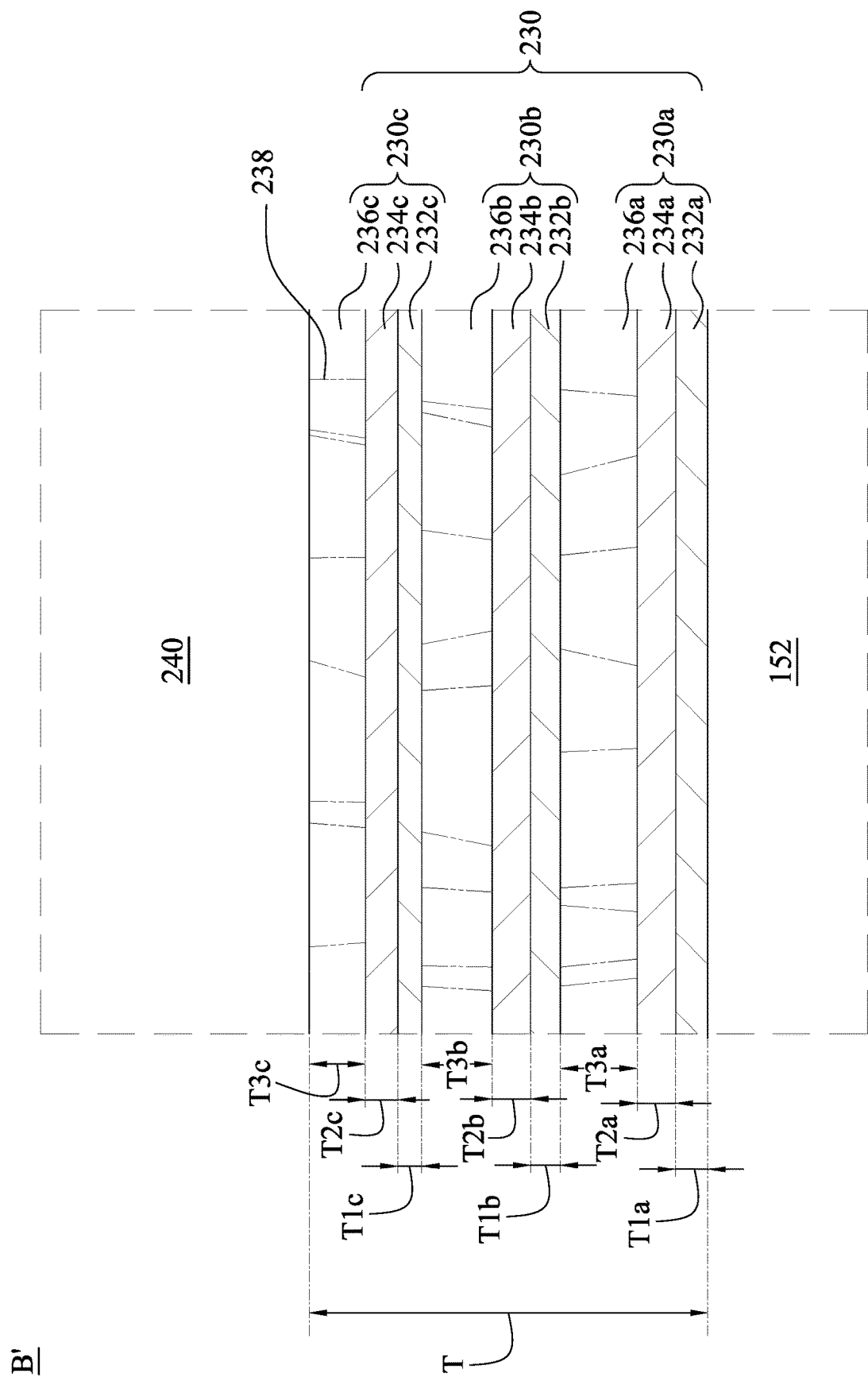
FIG. 10 is an enlarged view of the area B' in FIG. 9A in accordance with some embodiments of the present disclosure.

FIG. 10 is an enlarged view of the area B' in FIG. 9A in accordance with some embodiments of the present disclosure. The difference between the structures in FIGS. 10 and 9B pertains to the thicknesses of the layers in the barrier layer 230. In FIG. 10, the thickness T3a of the first top layer 236a is greater than the thickness T3b of the second top layer 236b, and the thickness T3b of the second top layer 236b is greater than the thickness T3c of the third top layer 236c. It may be because of the deposition rate of the barrier layer 230. For example, the deposition rate of the first top layer 236a is greater than the deposition rate of the second top layer 236b, and the deposition rate of the second top layer 236b is greater than the deposition rate of the third top layer 236c. However, the ratio of T1a:T2a:T3a is substantially equal to the ratio of T1b:T2b:T3b and substantially equal to the ratio of T1c:T2c:T3c. Other relevant structural details of the barrier layer 230 in FIG. 10 are substantially the same as or similar to the barrier layer 230 in FIG. 9B, and, therefore, a description in this regard will not be repeated hereinafter.

Figure 11:
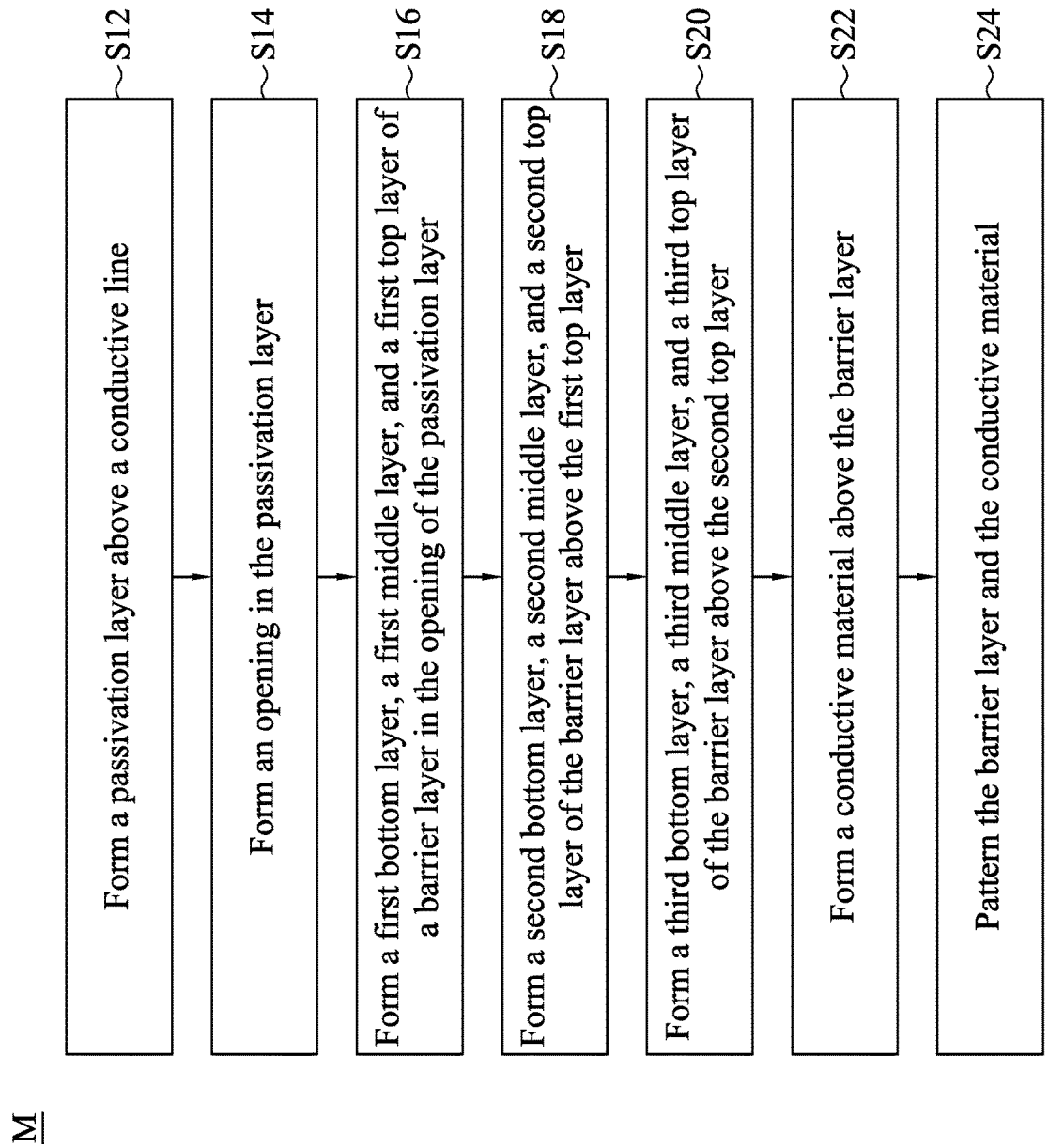
FIG. 11 is a flow chart of a method for forming a semiconductor structure in accordance with some embodiments of the present disclosure.

FIG. 11 is a flow chart of a method M for forming a semiconductor structure in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a passivation layer is formed above a conductive line. FIG. 2 illustrates a cross-sectional view of some embodiments corresponding to act in block S12. At block S14, an opening is formed in the passivation layer. FIGS. 3A and 3B illustrates cross-sectional views of some embodiments corresponding to act in block S14. At block S16, a first bottom layer, a first middle layer, and a first top layer of a barrier layer are formed in the opening of the passivation layer. FIG. 4 illustrates a cross-sectional view of some embodiments corresponding to act in block S16. At block S18, a second bottom layer, a second middle layer, and a second top layer of the barrier layer are formed above the first top layer. FIG. 5 illustrates a cross-sectional view of some embodiments corresponding to act in block S18. At block S20, a third bottom layer, a third middle layer, and a third top layer of the barrier layer are formed above the second top layer. FIG. 5 illustrates a cross-sectional view of some embodiments corresponding to act in block S20. At block S22, a conductive material is formed above the barrier layer. FIG. 6 illustrates a cross-sectional view of some embodiments corresponding to act in block S22. At block S24, the barrier layer and the conductive material are patterned. FIG. 7 illustrates a cross-sectional view of some embodiments corresponding to act in block S24.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the second and/or third bottom layers of the barrier layer block metal elements of the conductive line from diffuse to the pad layer. Another advantage is that the first, second, and third top layers of the barrier layer have misaligned threading dislocation defects, the metal elements are not easy to pass through all of the first, second, and third top layers. With such configuration, the fail rate of the semiconductor structure (e.g., the metal elements of the conductive line diffused to the pad layer) is reduced to lower than about 1% in some embodiments.

According to some embodiments, a semiconductor structure includes a multi-level interconnect structure, a passivation layer, a barrier layer, and a pad layer. The passivation layer is above the multi-level interconnect structure. The barrier layer lines an inner sidewall of the passivation layer, a top surface of the passivation layer and a top surface of a conductive line of the multi-level interconnect structure. The barrier layer includes a first layer, a second layer, a third layer, and a fourth layer. The first layer is in a nano-crystalline phase. The second layer is above the first layer and in an amorphous phase. The third layer is above the second layer and in a polycrystalline phase. The fourth layer is above the third layer and in a nano-crystalline phase. The pad layer is above the barrier layer.

According to some embodiments, a semiconductor structure includes a multi-level interconnect structure, a passivation layer, a pad layer, and a barrier layer. The passivation layer is above the multi-level interconnect structure. The pad layer is partially in the passivation layer and above the multi-level interconnect structure. The barrier layer is between the multi-level interconnect structure and the pad layer. The barrier layer includes a first tantalum-containing layer, a second tantalum-containing layer, and a third tantalum-containing layer. The second tantalum-containing layer is above the first tantalum-containing layer. The third tantalum-containing layer is above the second tantalum-containing layer. The first tantalum-containing layer and the third tantalum-containing layer have a higher nitrogen concentration than that of the second tantalum-containing layer, and a thickness of the second tantalum-containing layer is less than a thickness of the third tantalum-containing layer.

According to some embodiments, a method for manufacturing a semiconductor structure including forming a passivation layer above a conductive line. An opening is formed in the passivation layer to expose the conductive line. A barrier layer is formed in the opening of the passivation layer. The formation of the barrier layer includes forming a first layer in a nano-crystalline phase. A second layer is formed above the first layer and in an amorphous phase. A third layer is formed above the second layer and in a polycrystalline phase. A fourth layer is formed above the third layer and in a nano-crystalline phase. A conductive material is formed over the barrier layer. The barrier layer and the conductive material are patterned.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a passivation layer above a multi-level interconnect structure;
   forming an opening in the passivation layer to expose the multi-level interconnect structure;
   forming a barrier layer lining the opening in the passivation layer, comprising:
      forming a first layer in a nano-crystalline phase;
      forming a second layer above the first layer and in an amorphous phase;
      forming a third layer above the second layer and in a polycrystalline phase; and
      forming a fourth layer above the third layer and in a nano-crystalline phase;
   forming a conductive material over the barrier layer; and
   patterning the barrier layer and the conductive material.

2. The method of claim 1, wherein a material of the second layer is substantially the same as a material of the third layer.

3. The method of claim 1, wherein a material of the first layer is substantially the same as a material of the fourth layer.

4. The method of claim 1, wherein a power for forming the third layer is higher than a power for forming the fourth layer.

5. The method of claim 1, wherein a metal percentage of the fourth layer is higher than a metal percentage of the third layer.

6. The method of claim 1, wherein the third layer is a nitride layer.

7. The method of claim 1, wherein a ratio of thicknesses of the first layer, the second layer, and the third layer is in a range of about 1.2:1:8.5 to about 1.3:1:9.5.

8. A method for manufacturing a semiconductor structure, comprising:
   depositing a passivation layer above a multi-level interconnect structure;

forming an opening in the passivation layer to expose a conductive line in the multi-level interconnect structure;

depositing a barrier layer in the opening of the passivation layer, comprising:
  depositing a first tantalum nitride layer;
  depositing a tantalum layer above the first tantalum nitride layer; and
  depositing a second tantalum nitride layer above the tantalum layer, wherein a thickness of the tantalum layer is less than a thickness of the second tantalum nitride layer, and threading dislocation defects are formed in the second tantalum nitride layer;

depositing a conductive material above the barrier layer; and patterning the barrier layer and the conductive material.

9. The method of claim 8, wherein the tantalum layer is in a nano-crystalline phase.

10. The method of claim 8, wherein the first tantalum nitride layer is in a polycrystalline phase.

11. The method of claim 8, wherein depositing the barrier layer further comprises:
  depositing a third tantalum nitride layer above the first tantalum nitride layer prior to depositing the second tantalum nitride layer such that the second tantalum nitride layer is deposited above the third tantalum nitride layer.

12. The method of claim 11, wherein a ratio of a thickness of the third tantalum nitride layer to the thickness of the second tantalum nitride layer is in a range of about 0.094 and about 0.129.

13. The method of claim 11, wherein a thickness of the first tantalum nitride layer is greater than a thickness of the third tantalum nitride layer.

14. The method of claim 8, wherein a thickness of the first tantalum nitride layer is greater than the thickness of the second tantalum nitride layer.

15. The method of claim 8, wherein the second tantalum nitride layer is in a polycrystalline phase.

16. A method for manufacturing a semiconductor structure, comprising:
  forming an opening in a passivation layer to expose a conductive line under the passivation layer;
  depositing a barrier layer in the opening and in contact with the conductive line, comprising:
    depositing a first layer in a nano-crystalline phase;
    depositing a second layer above the first layer and in a poly-crystalline phase;
    depositing a third layer above the second layer and in the nano-crystalline phase; and
    depositing a fourth layer above the third layer and in the poly-crystalline phase;
  depositing a conductive material above the fourth layer of the barrier layer and in the opening; and
  patterning the barrier layer and the conductive material.

17. The method of claim 16, wherein a thickness of the second layer of the barrier layer is greater than a thickness of the fourth layer of the barrier layer.

18. The method of claim 16, wherein the third layer of the barrier layer is a substantially pure metal layer.

19. The method of claim 16, wherein threading dislocation defects are formed in the second layer and in the fourth layer.

20. The method of claim 19, wherein the threading dislocation defects in the second layer are misaligned with the threading dislocation defects in the fourth layer.

* * * * *